United States Patent
Strass

(10) Patent No.: US 10,232,487 B2
(45) Date of Patent: Mar. 19, 2019

(54) METHOD AND APPARATUS FOR TRIMMING PHOTOVOLTAIC MODULES

(75) Inventor: Manfred Strass, Harburg (DE)

(73) Assignee: Grenzebach Maschinenbau GmbH, Asbach-Baeumenheim (DE)

( * ) Notice: Subject to any disclaimer, the term of this patent is extended or adjusted under 35 U.S.C. 154(b) by 940 days.

(21) Appl. No.: 13/001,362

(22) PCT Filed: Jun. 29, 2009

(86) PCT No.: PCT/DE2009/000909
§ 371 (c)(1),
(2), (4) Date: Dec. 23, 2010

(87) PCT Pub. No.: WO2010/000235
PCT Pub. Date: Jan. 7, 2010

(65) Prior Publication Data
US 2011/0107887 A1 May 12, 2011

(30) Foreign Application Priority Data
Jul. 1, 2008 (DE) .......................... 10 2008 031 061

(51) Int. Cl.
*B24B 9/10* (2006.01)
*B24B 9/20* (2006.01)
(Continued)

(52) U.S. Cl.
CPC .................. *B24B 9/10* (2013.01); *B24B 9/20* (2013.01); *B24B 27/0069* (2013.01);
(Continued)

(58) Field of Classification Search
CPC .............. B32B 17/1099; C03B 33/076; C03B 33/078; B26D 1/045; B26D 7/00061;
(Continued)

(56) References Cited

U.S. PATENT DOCUMENTS 1,732,148 A * 10/1929 Barrett ........................... 83/383
3,319,500 A * 5/1967 Wild et al. ..................... 83/353
(Continued)

FOREIGN PATENT DOCUMENTS

CN 1145613 A 3/1997
CN 1447158 A 10/2003
(Continued)

OTHER PUBLICATIONS

International Search Report, International Application No. PCT/DE2009/000909, dated Dec. 27, 2010, 7 pages.

*Primary Examiner* — Clark F Dexter
(74) *Attorney, Agent, or Firm* — Slater Matsil, LLP

(57) ABSTRACT

An apparatus and a method for trimming a module are disclosed. In and embodiment the method includes fixing a rear transverse side of module, guiding the rear cutting head along the rear transverse side thereby cutting off a rear overlapping portion of the overlapping film and releasing the rear transverse. The method further includes moving the module into a region of two longitudinal cutting devices, fixing the module on both longitudinal sides, guiding longitudinal cutting heads along the longitudinal sides thereby cutting off longitudinally overlapping film portions on both longitudinal sides, and releasing the longitudinal sides of the module. The method furthermore includes moving the module into a region of the front cutting device, fixing a front transverse side of the module, guiding a front cutting head along the front transverse side thereby cutting off a front overlapping portion of the overlapping film.

18 Claims, 6 Drawing Sheets

(51) Int. Cl.
  *B24B 41/00* (2006.01)
  *B26D 1/18* (2006.01)
  *B26D 7/02* (2006.01)
  *B32B 17/00* (2006.01)
  *H01L 31/18* (2006.01)
  *B24B 27/00* (2006.01)
  *B32B 17/10* (2006.01)
  *B26D 7/00* (2006.01)

(52) U.S. Cl.
  CPC ........ *B24B 27/0076* (2013.01); *B24B 41/005* (2013.01); *B26D 1/18* (2013.01); *B26D 1/185* (2013.01); *B26D 7/025* (2013.01); *B32B 17/10036* (2013.01); *B32B 17/1099* (2013.01); *H01L 31/18* (2013.01); *B26D 2007/0068* (2013.01); *Y10S 83/914* (2013.01); *Y10T 83/04* (2015.04); *Y10T 83/0524* (2015.04); *Y10T 83/0605* (2015.04); *Y10T 83/178* (2015.04); *Y10T 83/4577* (2015.04); *Y10T 83/4645* (2015.04); *Y10T 83/541* (2015.04); *Y10T 83/6476* (2015.04); *Y10T 83/7487* (2015.04); *Y10T 83/8822* (2015.04)

(58) Field of Classification Search
  CPC .......... B26D 7/0006; B26D 2007/0068; B26D 1/04; B26D 1/06; B26D 1/065; B26D 1/10; B26D 1/105; B26D 1/11; B26D 1/115; B26D 1/18; B26D 1/185; B26D 7/02; B26D 7/025; B26D 7/04; B24B 9/10; B24B 9/20; B24B 27/0069; B24B 27/0076; B24B 41/005; Y10T 83/0356; Y10T 83/0363; Y10T 83/037; Y10T 83/0378; Y10T 83/0538; Y10T 83/0543; Y10T 83/0548; Y10T 83/0553; Y10T 83/0558; Y10T 83/0562; Y10T 83/06; Y10T 83/0605; Y10T 83/4577; Y10T 83/4579; Y10T 83/503; Y10T 83/6476; Y10T 83/6478; Y10T 83/648; Y10T 83/6481; Y10T 83/6483; Y10T 83/6489; Y10T 83/6491; Y10T 83/8822; Y10T 83/0524; Y10T 83/178; Y10T 83/4645; Y10T 83/7487; Y10S 83/914
  USPC ......... 83/42–47, 55, 56, 882–885, 914, 614, 83/255, 256, 357, 404, 404.1, 404.2, 83/404.3, 404.4, 407, 408, 39, 76.8, 282, 83/452
  See application file for complete search history.

(56) References Cited

U.S. PATENT DOCUMENTS

| | | | | |
|---|---|---|---|---|
| 4,187,755 | A | * | 2/1980 | Shirai .............................. 83/882 |
| 4,249,437 | A | * | 2/1981 | Hagenson ......................... 83/39 |
| 4,505,174 | A | * | 3/1985 | Carithers, Jr. .................. 83/455 |
| 4,592,261 | A | | 6/1986 | Miyaji et al. |
| 4,879,933 | A | | 11/1989 | Floreancig et al. |
| 4,979,411 | A | | 12/1990 | Murasaki et al. |
| 5,704,959 | A | * | 1/1998 | Lisec .............................. 65/174 |
| 5,733,353 | A | | 3/1998 | Bando |
| 6,557,689 | B2 | * | 5/2003 | Gariglio ..................... 198/345.1 |
| 6,604,984 | B2 | * | 8/2003 | Gariglio ........................... 451/5 |
| 6,910,953 | B2 | | 6/2005 | Allaire et al. |
| 7,497,762 | B2 | | 3/2009 | Chae et al. |
| 8,079,895 | B2 | | 12/2011 | Bando |
| 8,360,821 | B2 | | 1/2013 | Bando |
| 2002/0061712 | A1 | * | 5/2002 | Gariglio ........................... 451/5 |
| 2005/0284516 | A1 | | 12/2005 | Koll |
| 2006/0283537 | A1 | | 12/2006 | Lisec |

FOREIGN PATENT DOCUMENTS

| | | | |
|---|---|---|---|
| CN | 1490128 | A | 4/2004 |
| CN | 1526668 | A | 9/2004 |
| CN | 1684795 | A | 10/2005 |
| CN | 1826208 | A | 8/2006 |
| CN | 2882898 | Y | 3/2007 |
| CN | 101332578 | A | 12/2008 |
| DE | 3428547 | A1 | 2/1985 |
| DE | 3920671 | A1 | 12/1989 |
| DE | 3840843 | C1 | 7/1990 |
| DE | 69805680 | T2 | 12/2002 |
| DE | 10 2004 030 411 | A1 | 1/2006 |
| DE | 10 2005 027 964 | A1 | 12/2006 |
| EP | 0 861 813 | A1 | 9/1998 |
| EP | 1 166 961 | A1 | 1/2002 |
| EP | 1 382 441 | A1 | 1/2004 |
| EP | 1 733 843 | A1 | 12/2006 |
| EP | 2 100 860 | * | 9/2009 |
| EP | 2 177 329 | * | 4/2010 |
| EP | 2 492 245 | * | 8/2012 |
| JP | 05-057676 | A | 3/1993 |
| JP | 08-197402 | A | 8/1996 |
| JP | 2001135840 | A | 5/2001 |
| JP | 2001-260076 | A | 9/2001 |
| JP | 2001-320069 | A | 11/2001 |
| JP | 2006-026787 | A | 2/2006 |
| JP | 2006-179602 | A | 7/2006 |
| JP | 2007048504 | A | 2/2007 |

* cited by examiner

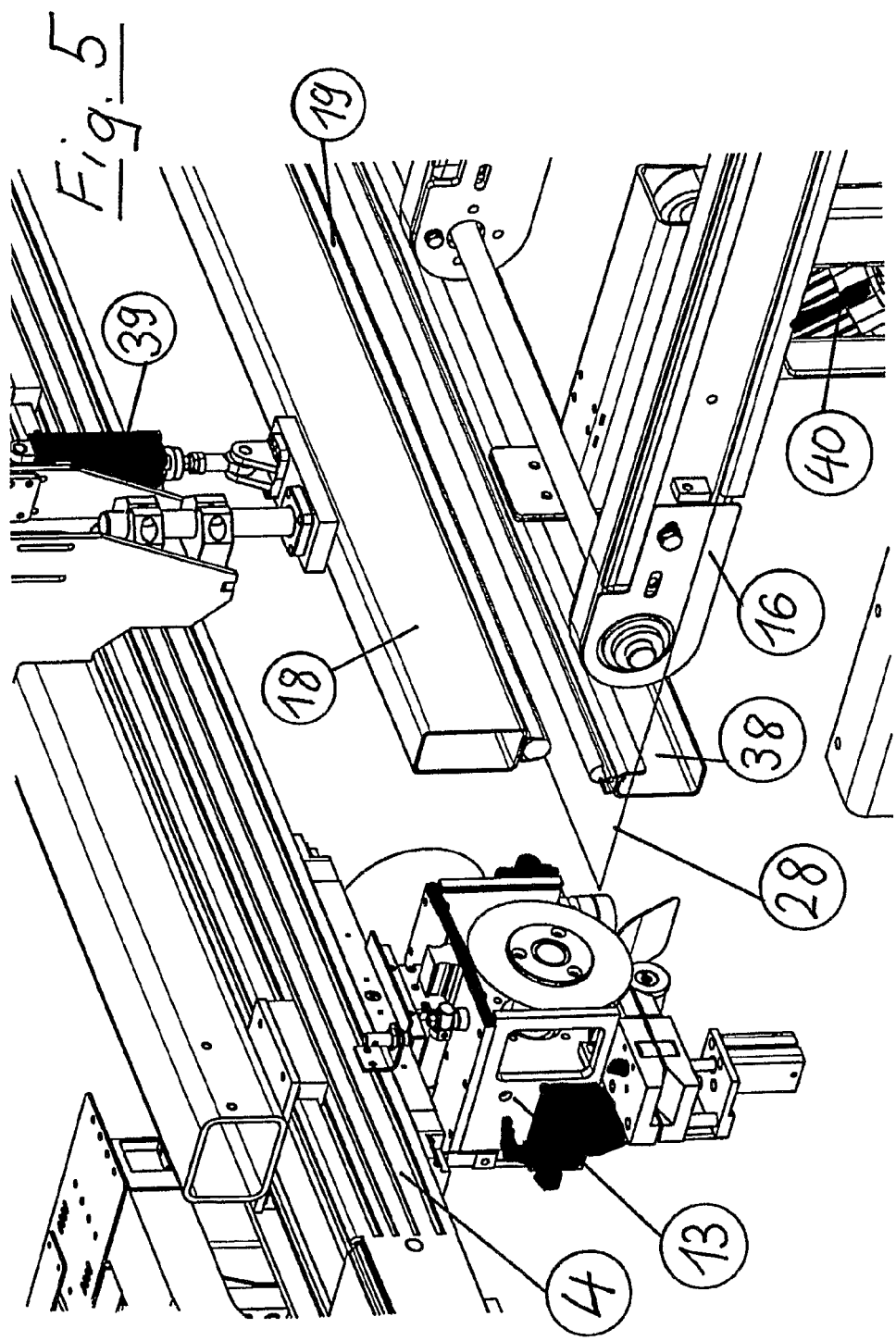

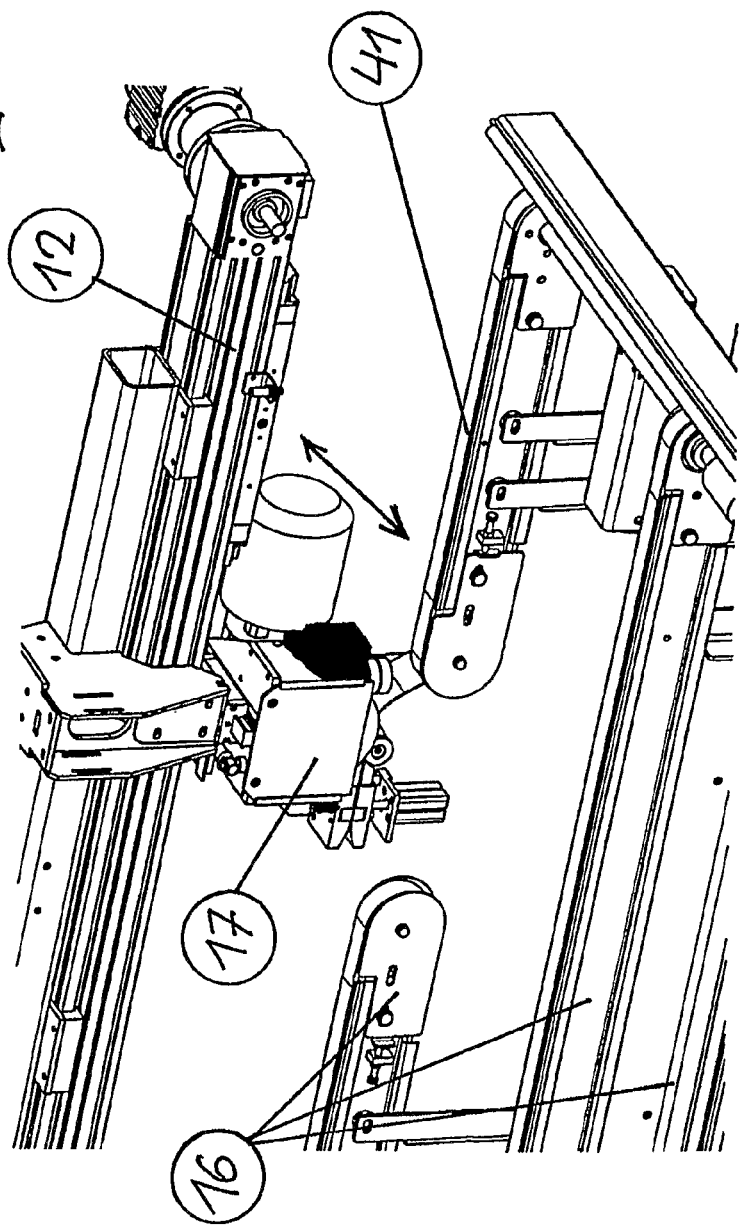

METHOD AND APPARATUS FOR TRIMMING PHOTOVOLTAIC MODULES

This patent application is a national phase filing under section 371 of PCT/DE2009/000909, filed Jun. 29, 2009, which claims the priority of German patent application 10 2008 031 061.1, filed Jul. 1, 2008, each of which is incorporated herein by reference in its entirety.

TECHNICAL FIELD

The invention relates to the automatic trimming of a rectangular photovoltaic module having two longitudinal sides and two transverse sides and consisting of two glass plates of equal size which rest one on top of the other and have an intermediate layer comprising a film which overlaps the glass plates on all sides.

BACKGROUND

In many cases, modern glass facades are not just a functional element of a structure, but in fact also serve increasingly for generating solar energy. Tailored solar modules make accurate integration into building grids and profiles possible. Semitransparent solar cells, but also opaque solar cells with transparent areas, make photovoltaic glazings appear to be flooded with light. Here, the solar cells often take on the desired effect of protection against the sun and glare.

The production of such photovoltaic systems requires operating conditions such as those which are conventional primarily in the production of semiconductors and integrated electronic circuits. In the production of photovoltaic systems, these so-called clean room conditions also additionally make it necessary to handle shock-sensitive glass plates with a large surface area.

For the safe handling of such glass plates, it is necessary to cut off, with correct dimensions, the film which is located between two glass plates during the production of so-called photovoltaic modules and protrudes at the edges. As viewed from the outside, a photovoltaic module involves the connection of a glass substrate plate, a photovoltaic element and a glass plate as covering glass by means of a film which bonds said glass plates under the action of heat.

DE 10 2004 030 411 A1 has disclosed such a photovoltaic element, a solar module as laminated safety glass.

It is an object of said laid-open specification to provide solar modules having the properties of laminated safety glazings using films based on polyvinyl butyral (PVB).

This object is achieved by means of a solar module as laminated safety glass, comprising a laminate of
 a) a glass pane,
 b) at least one solar cell unit arranged between two PVB-based films, and
 c) a back cover,
 characterized in that
 at least one of the PVB-based films has a tearing resistance of at least 16 N/mm$^2$.

It cannot be gathered from said document how such a film can be cut off given the protrusion determined, for reasons of adjustment, during the production.

DE 10 2005 027 964 A1 has disclosed a method and an apparatus for removing the plastics film protrusion in the case of laminated glass plates.

This publication is based on the object of providing a method and an apparatus, suitable in particular for carrying out said method, which make it possible to remove the plastics film protrusion mechanically and therefore not only more quickly and at a lower cost but also, above all, more accurately.

In order to achieve this object, claim 1 claims a method for removing the edge-side protrusion of the plastics film between the panes of a laminated glass plate, which method is characterized in that the plastics film protrusion is removed with sharply delineated edges by means of at least one rotating abrasive tool.

In said document, claim 9 furthermore claims an apparatus for removing the edge-side protrusion of the plastics film between the panes of a laminated glass plate, in particular for carrying out the method as claimed in one of claims 1 to 8. Said apparatus is characterized by a bearing or support surface for the laminated glass plate, a conveying means for moving the laminated glass plate linearly on or along said surface, a tool which is mounted in a fixed position on the edge of said surface and has a rotating abrasive disk which makes tangential contact, by way of a circumferential surface, with a longitudinal edge of the laminated glass plate, and a carriage which can be moved at right angles to the conveying apparatus (in the direction of the transverse dimension of the laminated glass plate) and bears a second, similar tool.

An explanatory drawing is not attached to said publication.

DE 10 2005 027 964 A1 substantially proposes the use of an abrasive rotating tool for removing the plastics film protrusion and the use of such a tool in a fixed position on a longitudinal side and movably on a transverse side. Said document does not deal with the special technical requirements for realizing this outlined measure in an automatic system, the technical boundary conditions to be taken into consideration and the requirements for quick cycle times.

SUMMARY

The apparatus according to an embodiment of the invention and the method according to an embodiment of the invention provide that a photovoltaic module is trimmed, i.e. superfluous plastics film is cut off, reliably on all sides at low cost with automatic control and with low cycle times.

BRIEF DESCRIPTION OF THE DRAWINGS

The apparatus according to embodiments of the invention is described in more detail in the text which follows. Specifically:

FIG. 5 is a perspective illustration from the region of the front transverse-side fixing device, and FIG. 6 is a perspective illustration of the right-hand cutting head.

Figure 1:
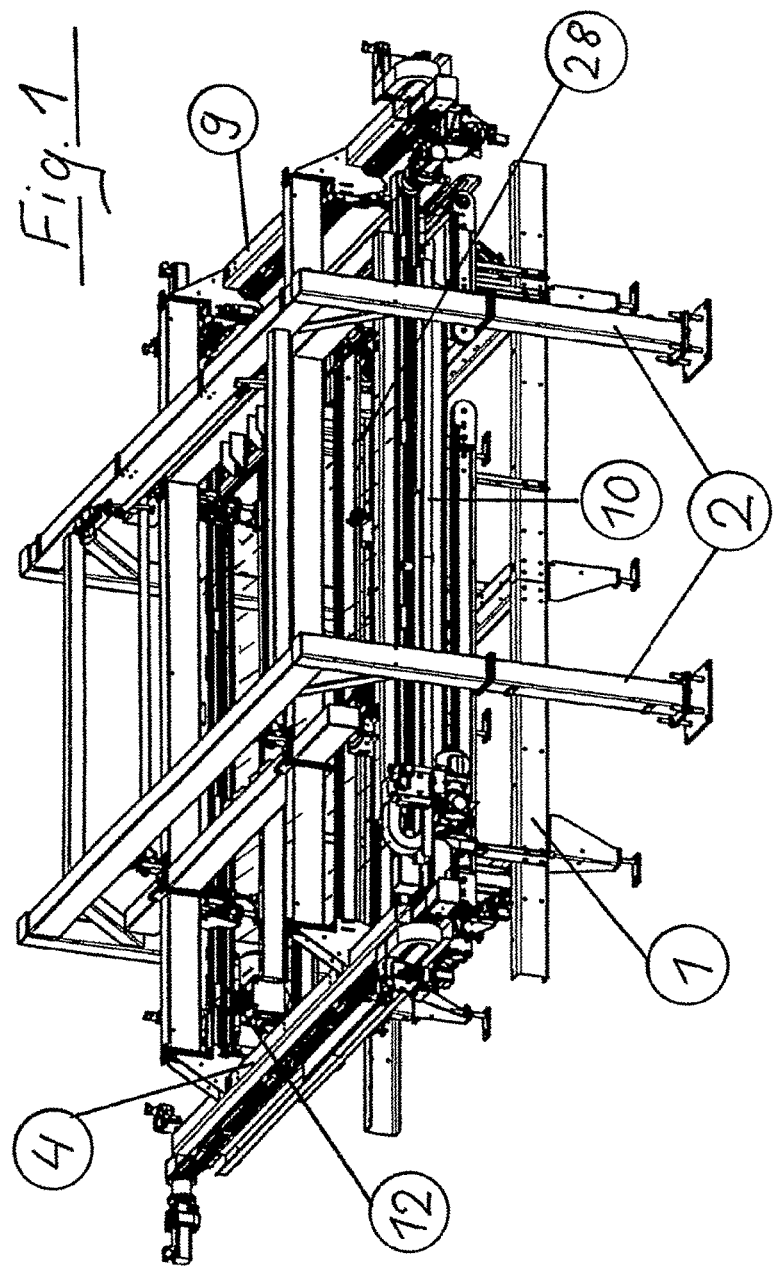
FIG. 1 is a perspective illustration of the apparatus according to an embodiment of the invention.

The following list of reference symbols may be used in conjunction with the drawings:
(1) Base frame
(2) Portal support for the film transverse cutting device
(3) Cutting head drive (cutting disk)
(4) Front running rail cross arm (crosscutter)
(5) Drive for the front transverse cutting device (6) Drive for the vertical movement of the transverse cutting devices and of the longitudinal cutting devices
(7) Drive for the rear transverse cutting device
(8) Longitudinal beams of the transverse cutting device
(9) Rear running rail cross arm (crosscutter)
(10) Left-hand running rail of the longitudinal cutting device
(11) Drive for the moving belt
(12) Right-hand running rail of the longitudinal cutting device
(13) Rear cutting head (transverse direction)
(14) Left-hand cutting head (longitudinal direction)
(15) Front cutting head (transverse direction)
(16) Conveyor belt for the photovoltaic module
(17) Right-hand cutting head (longitudinal direction)
(18) Upper module fixing device (support)
(19) Upper module fixing device (pressure-exerting means)
(20) Rear film guide
(21) Cutting disk
(22) Cutting wheel
(23) Lower bearing for the front film guide (lowerable)
(24) Castors for the front film guide
(25) Film outer edge
(26) Drive shaft for the conveyor belt
(27) Cutting head carriage
(28) Photovoltaic module
(29) Drive for the right-hand longitudinal cutting device
(30) Sensors for the positioning of the photovoltaic module
(31) Right-hand transverse adjustment drive (longitudinal cutting device)
(32) Left-hand transverse adjustment drive (longitudinal cutting device)
(33) Displacement device for the cutting head (contact pressure on castors)
(34) Pressure cylinder for the cutting head on the photovoltaic module
(35) Upper bearing of the film guide (fixed)
(36) Drive cylinder for the lower bearing of the film guide
(37) Sensor for the cutting head position
(38) Lower fixing device for the photovoltaic module
(39) Upper drive for the fixing device of the photovoltaic module
(40) Lower drive for the fixing device of the photovoltaic module
(41) Short conveyor belt
(42) Drive for the left-hand longitudinal cutting device

DETAILED DESCRIPTION OF THE DRAWINGS

FIG. 1 is a perspective illustration of the trimming apparatus in the course of the process for producing a photovoltaic module (28). The arrow on the right-hand side of the corresponding figure, FIG. 2, indicates the run-in direction of a module (28) to be trimmed. Correspondingly, the arrow on the left-hand side points in the direction of the path for further processing of a module (28).

As viewed from the outside, a photovoltaic module (28) consists essentially of two rectangular glass plates of equal size which rest one on top of the other and have an intermediate layer comprising a film which overlaps the glass plates on all sides. The purpose of the apparatus according to an embodiment of the invention is to automatically cut off the overlapping film at the edges of the glass plates cleanly and accurately. In the text which follows, such a photovoltaic module (28) will merely be referred to as module (28).

In this FIGURE, (2) denotes the portal supports for the front and the rear film transverse cutting devices.

The left-hand side shows the front running rail cross arm (4) and the right-hand side shows the rear running rail cross arm (9) of the corresponding crosscutters. Here, it is noted that the terms "front" or "rear" refer to the running direction of a module (28) during the trimming operation. In FIG. 1, "front" therefore refers to the left-hand side of the image and "rear" to the right-hand side of the image. Similarly, the term "left" with respect to the two longitudinal cutting devices refers, as viewed in the running direction of a module (28), to that side which faces toward the viewer, i.e. the front side of the trimming apparatus in FIG. 1. Accordingly, the term "right" refers to the rear side of the trimming apparatus, i.e. that side which is remote from the viewer in FIG. 1.

(12) denotes the right-hand running rail of the longitudinal cutting device, which extends along the running direction of a module (28), which can be seen concealed in the center, on that side which is remote from the viewer. The left-hand running rail (10) of the longitudinal cutting device is shown on the other side of the trimming apparatus, facing toward the viewer.

Figure 2:
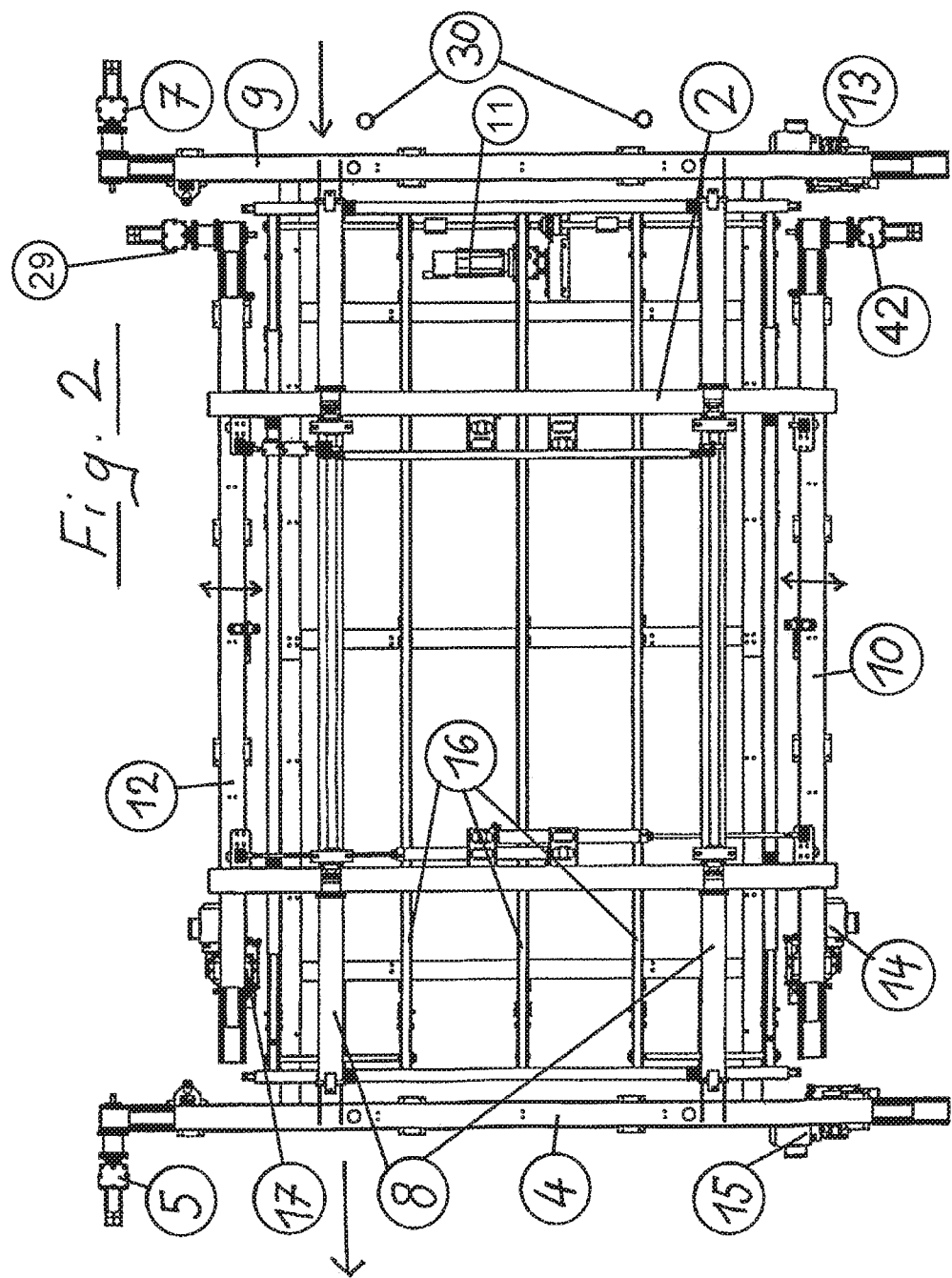
FIG. 2 is a plan view from the region of the cutting devices.

FIG. 2 is a plan view from the region of the cutting devices. The features which can be seen protruding the most in FIG. 2 are the rear running rail cross arm (9) and the front running rail cross arm (4), which have already been mentioned in the description of FIG. 1 and are both connected via the two longitudinal beams (8) of the transverse cutting device. The rear running rail cross arm (9) in this case bears the drive (7), which makes it possible for the rear cutting head (13) to move along said cross arm. Accordingly, the drive (5) makes it possible for the front cutting head (15) to move along the running rail cross arm (4). The left-hand and right-hand running rails (10) and (12) of the longitudinal cutting device, which are known from the description of FIG. 1, are shown in FIG. 2, in each case provided in the center with a double-headed arrow. As a result, it should already be pointed out at this point that these running rails (10, 12) can be adjusted in terms of their parallel spacing from one another according to the landscape format of a module (28) to be trimmed in each case (cf. in this respect also FIG. 6).

The left-hand cutting head (14) of the longitudinal cutting device is fastened to the left-hand running rail (10), and the running rail (12) accordingly bears the right-hand cutting head (17). The drive (11) for the conveyor belt or belts (16) is shown in the middle on the right-hand side of FIG. 2. The portal support (2) for the transverse cutting device can likewise be seen in FIG. 2.

The sensors (30) for detecting the position of a module (28) are shown in the region of the rear running rail cross arm (9). They not only make it possible to accurately determine the front edge of an arriving module (28), but can also establish whether said edge extends at a right angle to the longitudinal direction of the trimming apparatus or deviates therefrom. An increase in the number and/or in the spacing of such sensors (30) increases the accuracy of such a measurement.

Furthermore, the sensors (30) can record the position of the rear edge of a module (28). The length of the module (28) can be calculated from the transient time difference for the recording of these two edges. However, it is also possible to use other sensors familiar to a person skilled in the art for this purpose.

Figure 3:
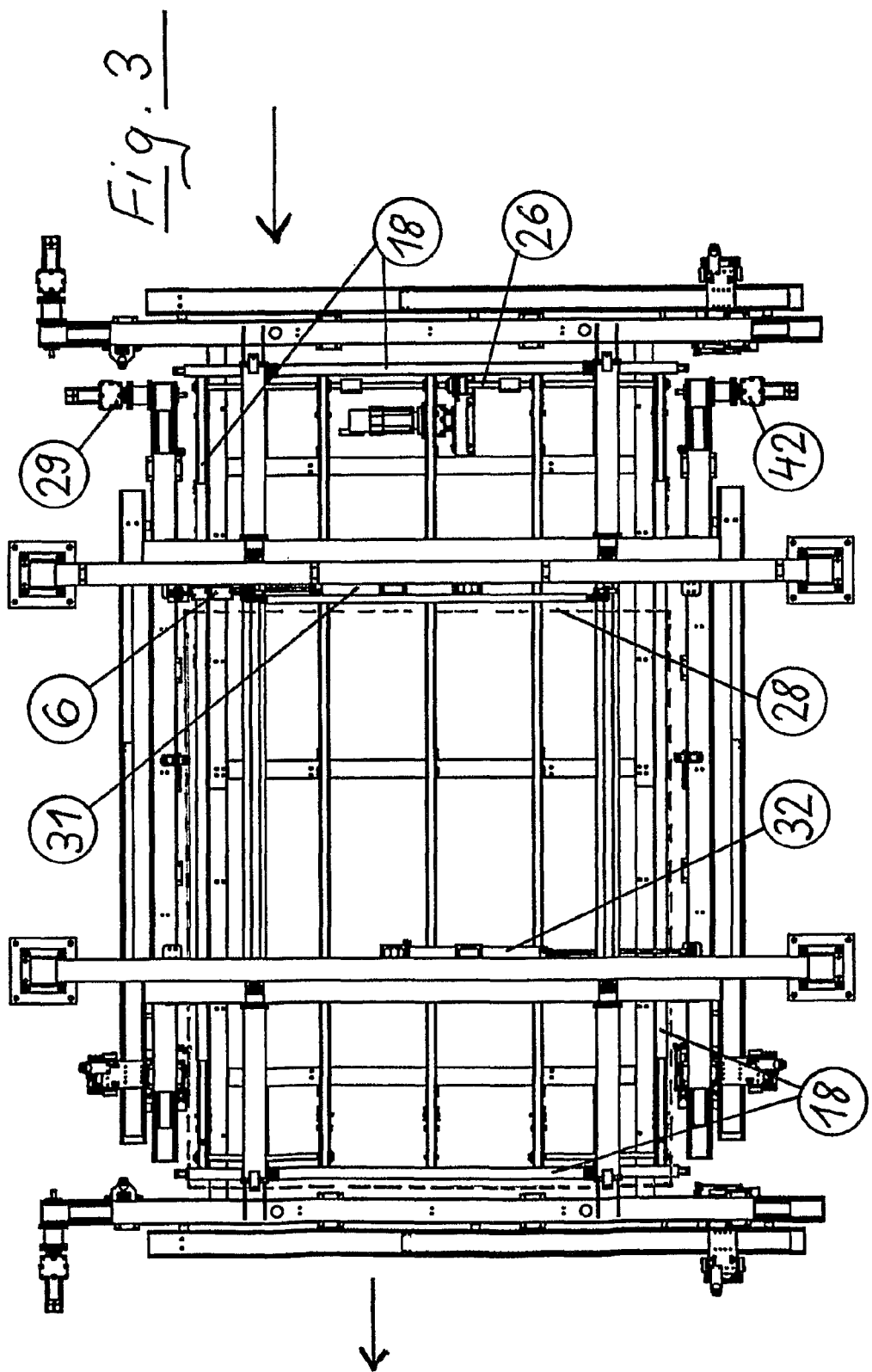
FIG. 3 is a plan view from the region of the fixing apparatuses.

FIG. 3 is a plan view from the region of the fixing apparatuses. Here, (29) and (42) denote the drives which are located opposite one another for the right-hand longitudinal cutting device and the left-hand longitudinal cutting device.

The supports (18), denoted in each case twice on the left-hand side and on the right-hand side, for the upper module fixing device can likewise be seen in this image. They are denoted by the same number for the transverse cutting devices and the longitudinal cutting devices since they have the same effect for each, specifically that of pressing the module (28) onto the base on the respective sides via the pressure-exerting means (not shown here). This is intended to prevent the two glass plates of a module from being mutually displaced during the operation to sever the film lying between them. For a more detailed illustration of a fixing device, reference is made to FIG. 5. In this illustration of FIG. 3, it is readily possible to see the left-hand transverse adjustment drive (32) of the longitudinal cutting device and the right-hand transverse adjustment drive (31) of the longitudinal cutting device in the central region of the trimming apparatus, where a module (28) is shown. As already observed in the description of FIG. 2, these drives are used to automatically adapt the spacing between the two longitudinal cutting devices to the width of the respective module.

(6) denotes the drive for the simultaneous vertical movement of the transverse cutting device and of the longitudinal cutting device. This is necessary in order to adapt the cutting operation as a whole to different glass thicknesses. This operation may likewise proceed automatically. The respective glass thicknesses of the modules (28) are measured using sensors, the selection of which is left up to a person skilled in the art and which are not shown in greater detail for reasons of clarity. The output signals from these sensors are available to the control program.

Figure 4:
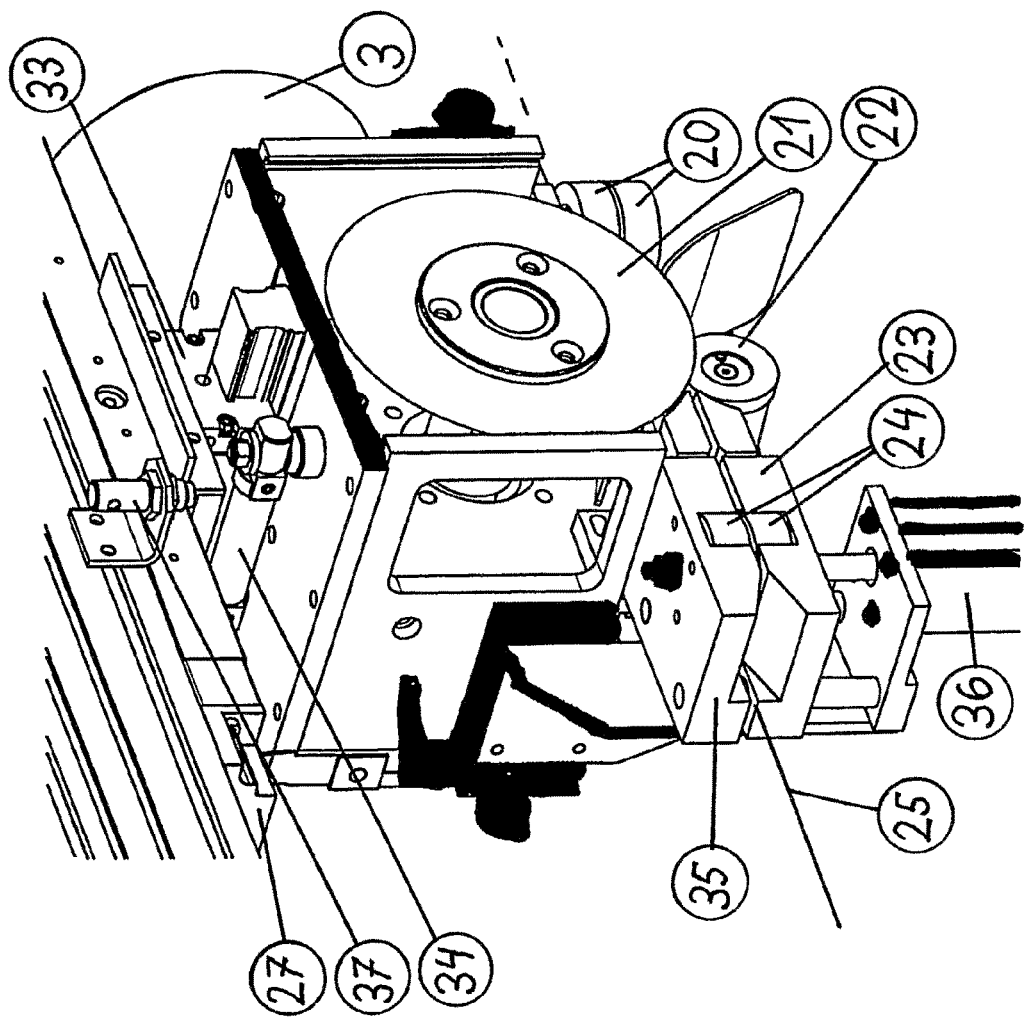
FIG. 4 is a perspective illustration of a cutting head.

FIG. 4 is a perspective illustration of one of the total of four cutting heads used for all four sides of a module (28).

The drive (3), which can be seen here in its outer border, brings about the rotation of the cutting disk (21) and, together with the cutting wheel (22) and the propulsion of the cutting head, forces the respective overlapping film to be severed. The castors (24) for the front film guide, together with the rear film guide (20), ensure the stop for constant bearing of a cutting head, defined in terms of its spacing from the glass edges of a module (28), during the cutting operation. In order to ensure that a film is introduced into the operation region of a cutting head before the start of a cutting operation, the castors (24) for the front film guide and the rollers (20) for the rear film guide are jointly folded away from one another. This operation is carried out by the drive cylinder (36), which can move the lower bearing (23) for the front film guide, which is mechanically connected to the lower roller (20), vertically. The outer edge of a corresponding film is denoted by (25), and the stationary upper bearing of the film guide is provided with the numeral (35). The pressure cylinder (34) ensures, by means of the displacement device (33), that there is a defined contact pressure of the cutting head on a module (28).

A sensor (37) is used to determine the exact position of a cutting head for the control program of the trimming apparatus. The output signals from said sensor are recorded and evaluated for the control program of the trimming system.

FIG. 5 is a perspective illustration, by way of example, from the region of the front transverse-side fixing device. The front cutting head (13) is shown on the front running rail cross arm (4) in a position, or at a point in time, since the support (18) of the upper fixing device is pressed by the upper drive (39) by means of the pressure-exerting means (19) onto a module (28), the module (28) being pressed from below upward via the lower drive (40) and the lower fixing device (38).

FIG. 6 shows an extension of the conveyor belt (16) by a short conveyor belt (41). This gap which is thus produced in the conveyor belt (16) makes it possible for the right-hand cutting head (17), which is shown by way of example, to "pass through" the conveyor belt (16) in the event that it is necessary to adjust the right-hand running rail (12) of the longitudinal cutting device in the direction of the double-headed arrow shown. Such adjustment is necessary when the trimming apparatus is converted to a different format (cf. in this respect also FIG. 2).

In order to ensure that the film is cut off cleanly and to prevent tearing or pulling off, the propulsion of the cutting heads is decelerated to a defined extent before the end of the cutting operation. Results of preliminary tests with different glass thicknesses and different types of film and film thicknesses are included as operating parameters in the control program for the system. The program is likewise able to record different formats of modules by means of appropriate sensors and to automatically react, by automatic adjustment of the longitudinal cutting device and by means of calculated values, to the altered feed paths and feed rates of the cutting heads.

Further disclosed is a method for automatically trimming a rectangular photovoltaic module, the module having two longitudinal sides and two transverse sides, two glass plates of equal size which rest one on top of the other, and an intermediate layer comprising a film which overlaps the glass plates on all sides, the method comprising:
  a) moving the module in a horizontal position into a region of a trimming apparatus, wherein the position of a front edge is detected and recorded;
  b) moving the module until a rear edge is located in a specific, defined starting position;
  c) determining a glass thickness of the module and vertically adapting all cutting apparatuses to the glass thickness;
  d) fixing a rear transverse side of the module;
  e) moving vertically downward a lower bearing of a film guide, moving upward a corresponding cutting head, moving upward again the lower bearing and guiding upward the cutting head to the glass edge of the module;
  f) guiding the cutting head together with a rotating cutting disk along the rear transverse side and cutting off the overlapping film;
  g) moving the module into a region of two longitudinal cutting devices, fixing the module on both longitudinal sides and, according to features d) and e), cutting off the overlapping films on both longitudinal sides;
  h) moving the module into a region of the front transverse cutting device, fixing the front transverse side of the module and, according to features d) and e), cutting off the overlapping film; and
  i) moving the trimmed module for further processing.

The invention claimed is:

1. A method for automatically cutting overlapping portions of a film of a module in a cutting apparatus, the cutting apparatus comprising a conveyor, a front cutting head, a rear cutting head and longitudinal cutting heads, the method comprising:
  moving the module in a horizontal position into the cutting apparatus by the conveyor, wherein the module comprises glass plates and the film located between the glass plates;
  fixing a rear transverse side of the module;

guiding the rear cutting head along the rear transverse side thereby cutting off a rear overlapping portion of the film;

releasing the rear transverse side;

moving the module into a region of the longitudinal cutting heads by the conveyor;

fixing longitudinal sides of the module;

guiding the longitudinal cutting heads along the longitudinal sides thereby cutting off longitudinally overlapping portions of the film on both longitudinal sides;

releasing the longitudinal sides;

moving the module into a region of the front cutting head by the conveyor;

fixing a front transverse side of the module; and guiding the front cutting head along the front transverse side thereby cutting off a front overlapping portion of the film, wherein the moving the module into the region of the longitudinal cutting heads and the moving the module into the region of the front cutting head are separate moves, and wherein each of the fixing steps comprises pressing an upper fixing device against the module by an upper drive and pressing a lower fixing device against the module by a lower drive.

2. The method as claimed in claim 1, further comprising adjusting a spacing between the longitudinal cutting heads for different landscape formats of different modules.

3. The method as claimed in claim 1, further comprising decelerating each of the front, rear and longitudinal cutting heads before an end of a respective cutting operation thereof.

4. The method as claimed in claim 1, further comprising recording, via sensors, empirical values for different modules and films in a memory and using stored empirical values for controlling of the method.

5. The method as claimed in claim 1, further comprising detecting and recording a front edge of the module, detecting and recording a rear edge of the module and calculating a length of the module based on the detecting of the front edge and the rear edge.

6. The method as claimed in claim 1, wherein each of the cutting heads comprises a rotating cutting disk.

7. The method as claimed in claim 1, further comprising determining a glass thickness of the module and vertically moving each of the cutting heads.

8. The method as claimed in claim 1, wherein the module is a photovoltaic module.

9. An apparatus for trimming a module, the module comprising glass plates of equal size resting on top of each other and an overlapping film overlapping the glass plates on all sides, the apparatus comprising:

a conveyor configured to move the module in the apparatus;

holding devices configured to hold the module, wherein the holding devices include a first holding device at a first position along the conveyor, a second holding device and a third holding device at a second position along the conveyor, and a fourth holding device at a third position along the conveyor;

longitudinal cutting heads movably mounted to respective longitudinal rails and movable along the longitudinal rails;

a first cross cutting head movably mounted to a first cross rail and movable along the first cross rail; and a second cross cutting head movably mounted to a second cross rail and movable along the second cross rail, wherein the conveyor is configured to move the module to the first position so that a rear transverse side of the module is fixable by the first holding device and the overlapping film is cuttable by the first cross cutting head, wherein the conveyor is further configured to move the module to the second position so that longitudinal sides of the module are fixable by the second and third holding devices and the overlapping film is cuttable by the longitudinal cutting heads, wherein the conveyor is further configured to move the module to the third position so that a front transverse side of the module is fixable by the fourth holding device and the overlapping film is cuttable by the second cross cutting head, and wherein a move from the first position to the second position is separate from the move from the second position to the third position.

10. The apparatus as claimed in claim 9, further comprising drives configured to adjust a spacing between the longitudinal cutting heads for different landscape formats of different modules.

11. The apparatus as claimed in claim 9, wherein each of the cutting heads is capable of being decelerated before an end of a respective cutting operation.

12. The apparatus as claimed in claim 9, further comprising sensors and a memory, wherein empirical values for different modules and films are sensed by the sensors, and wherein the empirical values are stored in the memory.

13. The apparatus as claimed in claim 9, wherein each of the cutting heads comprises a rotating cutting disk.

14. The apparatus as claimed in claim 9, wherein each of the holding devices comprises an upper drive and an upper fixing device, and a lower drive and a lower fixing device, wherein the upper fixing device is configured to be pressed against a top surface of the module by the upper drive, and wherein the lower fixing device is configured to be pressed against a bottom surface of the module by the lower drive.

15. The apparatus as claimed in claim 9, wherein each of the cutting heads is vertically adjustable for adapting to a glass thickness of the module.

16. A method for automatically cutting overlapping portions of a film of a module in a cutting apparatus, the cutting apparatus comprising a conveyor, a front cutting head, a rear cutting head and longitudinal cutting heads, the method comprising:

moving the module in a horizontal position into the cutting apparatus by the conveyor, wherein the module comprises glass plates and the film located between the glass plates;

fixing a rear transverse side of the module;

guiding the rear cutting head along the rear transverse side thereby cutting off a rear overlapping portion of the film;

releasing the rear transverse side;

moving the module into a region of the longitudinal cutting heads;

fixing longitudinal sides of the module;

guiding the longitudinal cutting heads along the longitudinal sides thereby cutting off longitudinally overlapping portions of the film on both longitudinal sides;

releasing the longitudinal sides;

moving the module into a region of the front cutting head;

fixing a front transverse side of the module; and guiding the front cutting head along the front transverse side thereby cutting off a front overlapping portion of the film, wherein each of the fixing steps comprises pressing an upper fixing device against the module by an upper drive and pressing a lower fixing device against the module by a lower drive.

17. An apparatus for trimming a module, the module comprising glass plates of equal size resting on top of each other and an overlapping film overlapping the glass plates on all sides, the apparatus comprising:
 a conveyor configured to move the module in the apparatus;
 holding devices configured to hold the module, wherein the holding devices include a first holding device at a first position along the conveyor, a second holding device and a third holding device at a second position along the conveyor, and a fourth holding device at a third position along the conveyor;
 longitudinal cutting heads movably mounted to respective longitudinal rails and movable along the longitudinal rails;
 a first cross cutting head movably mounted to a first cross rail and movable along the first cross rail; and
 a second cross cutting head movably mounted to a second cross rail and movable along the second cross rail,
 wherein the conveyor is configured to move the module to the first position so that a rear transverse side of the module is fixable by the first holding device and the overlapping film is cuttable by the first cross cutting head,
 wherein the conveyor is further configured to move the module to the second position so that longitudinal sides of the module are fixable by the second and third holding devices and the overlapping film is cuttable by the longitudinal cutting heads,
 wherein the conveyor is further configured to move the module to the third position so that a front transverse side of the module is fixable by the fourth holding device and the overlapping film is cuttable by the second cross cutting head,
 wherein each of the holding devices comprises an upper drive and an upper fixing device, and a lower drive and a lower fixing device, wherein the upper fixing device is configured to be pressed against a top surface of the module by the upper drive, and wherein the lower fixing device is configured to be pressed against a bottom surface of the module by the lower drive.

18. The apparatus as claimed in claim 17, wherein each of the cutting heads is vertically adjustable for adapting to a glass thickness of the module.

* * * * *